(12) United States Patent
Sreenivasan et al.

(10) Patent No.: US 8,961,800 B2
(45) Date of Patent: Feb. 24, 2015

(54) FUNCTIONAL NANOPARTICLES

(75) Inventors: Sidlgata V. Sreenivasan, Austin, TX (US); Shuqiang Yang, Austin, TX (US); Frank Y. Xu, Round Rock, TX (US); Vikramjit Singh, Austin, TX (US)

(73) Assignees: Board of Regents, The University of Texas System, Austin, TX (US); Molecular Imprints, Inc., Austin, TX (US)

(*) Notice: Subject to any disclaimer, the term of this patent is extended or adjusted under 35 U.S.C. 154(b) by 463 days.

(21) Appl. No.: 12/854,359

(22) Filed: Aug. 11, 2010

(65) Prior Publication Data

US 2011/0049096 A1    Mar. 3, 2011

Related U.S. Application Data

(60) Provisional application No. 61/236,957, filed on Aug. 26, 2009.

(51) Int. Cl.
| | | |
|---|---|---|
| *B44C 1/22* | (2006.01) | |
| *G03F 7/00* | (2006.01) | |
| *B82Y 10/00* | (2011.01) | |
| *B82Y 40/00* | (2011.01) | |
| *B82Y 30/00* | (2011.01) | |

(52) U.S. Cl.
CPC .............. *G03F 7/0002* (2013.01); *B82Y 10/00* (2013.01); *B82Y 30/00* (2013.01); *B82Y 40/00* (2013.01)
USPC .................. 216/40; 216/36; 216/41; 438/692

(58) Field of Classification Search
CPC ............ H01L 21/0272; H01L 21/0274; H01L 21/0331; H05K 3/048; C23F 1/14
USPC ................. 216/13, 24, 26, 41, 106, 8, 36, 40; 438/669, 670, 748, 692
See application file for complete search history.

(56) References Cited

U.S. PATENT DOCUMENTS

| | | |
|---|---|---|
| 6,696,220 B2 | 2/2004 | Bailey et al. |
| 6,873,087 B1 | 3/2005 | Choi et al. |
| 6,918,946 B2 | 7/2005 | Korgel et al. |

(Continued)

FOREIGN PATENT DOCUMENTS

| | | |
|---|---|---|
| EP | 2216680 | 8/2010 |
| EP | 2312393 | 4/2011 |

(Continued)

OTHER PUBLICATIONS

Jang et al. Nanoscopic Pd Line Arrays Using Nanocontact Printed Dendrimers, Langmuir 20060328 American Chemical Society vol. 22 No. 7, pp. 3326-3331.

(Continued)

*Primary Examiner* — Lan Vinh
(74) *Attorney, Agent, or Firm* — Cameron A. King

(57) ABSTRACT

Functional nanoparticles may be formed using at least one nano-lithography step. In one embodiment, sacrificial material may be patterned on a multi-layer substrate using an imprint lithography system. The pattern may be further etched into the multi-layer substrate. Functional material may then be deposited on multi-layer substrate and solidified. At least a portion of the functional material may then be removed to provide a crown surface exposing pillars. Pillars may be removed from multi-layer substrate forming functional nanoparticles.

27 Claims, 8 Drawing Sheets

(56) References Cited

U.S. PATENT DOCUMENTS

| | | | |
|---|---|---|---|
| 6,936,194 | B2 | 8/2005 | Watts |
| 7,157,036 | B2 | 1/2007 | Choi et al. |
| 7,179,396 | B2 | 2/2007 | Sreenivasan |
| 7,396,475 | B2 | 7/2008 | Sreenivasan |
| 7,635,263 | B2 | 12/2009 | Cherala et al. |
| 7,635,445 | B2 | 12/2009 | Choi et al. |
| 7,636,999 | B2 | 12/2009 | Choi et al. |
| 7,705,237 | B2 | 4/2010 | Swanson |
| 7,759,407 | B2 | 7/2010 | Xu |
| 7,798,801 | B2 | 9/2010 | Babbs et al. |
| 7,811,934 | B2 * | 10/2010 | Jeong et al. ............ 438/669 |
| 2004/0065252 | A1 | 4/2004 | Sreenivasan et al. |
| 2004/0065976 | A1 | 4/2004 | Sreenivasan et al. |
| 2004/0178076 | A1 | 9/2004 | Stonas et al. |
| 2004/0211754 | A1 | 10/2004 | Sreenivasan |
| 2004/0241896 | A1 * | 12/2004 | Zhou et al. ............ 438/48 |
| 2005/0187339 | A1 | 8/2005 | Xu et al. |
| 2006/0021967 | A1 | 2/2006 | Lee |
| 2006/0063387 | A1 * | 3/2006 | Miller et al. ............ 438/735 |
| 2006/0172031 | A1 | 8/2006 | Babbs et al. |
| 2007/0031505 | A1 | 2/2007 | Roy et al. |
| 2008/0122106 | A1 * | 5/2008 | Nitta et al. ............ 257/773 |
| 2008/0182070 | A1 * | 7/2008 | Chou et al. ............ 428/138 |
| 2009/0061152 | A1 | 3/2009 | Desimone et al. |
| 2009/0196826 | A1 | 8/2009 | Gao et al. |
| 2010/0120251 | A1 | 5/2010 | Sreenivasan et al. |
| 2011/0190463 | A1 | 8/2011 | Xu et al. |
| 2012/0114559 | A1 | 5/2012 | Singh et al. |

FOREIGN PATENT DOCUMENTS

| | | |
|---|---|---|
| GB | 2334347 | 8/1999 |
| WO | WO/02/29136 | 4/2002 |
| WO | WO/2007/081410 A2 | 7/2007 |
| WO | WO/2007/094829 | 8/2007 |
| WO | WO/2008/106503 | 9/2008 |
| WO | WO/2009/014848 | 1/2009 |
| WO | WO/2011/025522 | 3/2011 |

OTHER PUBLICATIONS

Glangchai et al. Nanoimprint lithography based fabrication of shape-specific, enzymatically-triggered smart nanoparticles. Journal of Controlled Release. 2008. vol. 125 pp. 283-272; Nov. 4, 2007.

Kelly et al. Shape-specific monodisperse nano-molding of protein particles. J. Am. Chem. Soc. 2008, vol. 130, pp. 5437-5439; Apr. 1, 2008.

Canelas et al. Top-down particles fabrication: control of size and shape for diagnostic imaging and drug delivery. WIREs Nanomedicine and Nanobiotechnology, 2009, vol. 1, pp. 391-404; Jul. 1, 2009.

Hu et al., High-Moment Antiferromagnetic Nanoparticles with Tunable Magnetic Properties, Advanced Materials 2008, vol. 20 pp. 1479-1483.

Gratton et al. Nanofabricated particles for engineered drug therapies: a preliminary biodistribution study of PRINT nanoparticles, J Control Release. Aug. 16, 2007; vol. 121 pp. 10-18.

Hamidi et al. Hydrogel nanoparticles in drug delivery, Advanced Drug Delivery Reviews, vol. 60 (2008), pp. 1638-1649, Sep. 20, 2008.

Hans et al. Biodegradable nanoparticles for drug delivery and targeting, Current Opinion in Solid State and Materials Science, 2002. 6(4): p. 319-327, Sep. 4, 2002.

Hughes, Nanostructure-mediated drug delivery, Nanomedicine: nanotechnology, biology, and medicine, 2005. 1(1): p. 22-30; Nov. 30, 2004.

Brigger et al., Nanoparticles in cancer therapy and diagnosis, Advanced Drug Delivery Reviews, 2002. 54(5): p. 631-651; May 10, 2002.

Egitto, Plasma Etching and Modification of Organic Polymers, Pure and Applied Chemistry, 62:9 (1990) 1699-1708.

Kushida et al. Dry-Etching Durability of Copolymers and Polymer Blends of Vinylnaphthalene or α-Methylstyrene with Methyl Methacrylate, Japanese Journal of Applied Physics, 34:1:8A (1995) 4234-4238; May 31, 1995.

Cho et al. Identification of Hydrophilic Group Formation on Polymer Surface during Ar+ Ion Irradiation in O2 Environment; Material Research Society Symposium Proceedings 438 (1997) 517-532.

Koh et al. Surface Modification of Polymer by Ion Assisted Reaction in Reactive Gases Environment; Material Research Society Symposium Proceedings 438 (1997) 505-510.

Hollander et al. On Depth Profiling of Polymers by Argon Ion Sputtering; Plasma Processes and Polymers, 4 (2007) 773-776.

Qui et al. Design and Evaluation of Layered Diffusional Matrices for Zero-Order Sustained-Release; Journal of Controlled Release, vol. 51 (1988), pp. 123-130, May 30, 1997.

Qui et al. Design of a Core-Shelled Polymer Cylinder for Potential Programmable Drug Delivery; International Journal of Pharmaceutics, vol. 219, pp. 151-160, May 5, 2001.

Okuda et al. Time-programmed Dual Release Formulation by Multilayered Drug-loaded Nanofiber Meshes; Journal of Controlled Release, vol. 143, pp. 258-264 (Jan. 13, 2010).

Akita et al. Multilayered Nanoparticles for Penetrating the Endosome and Nuclear Membrane via a Step-wise Membrane Fusion Process; Biomaterials, vol. 30 (2009), pp. 2940-2049, Mar. 4, 2009.

\* cited by examiner

FUNCTIONAL NANOPARTICLES

CROSS-REFERENCE TO RELATED APPLICATIONS

The application claims the benefit under 35 U.S.C. §119(e)(1) of U.S. Provisional Application No. 61/236,957, filed on Aug. 26, 2009, which is hereby incorporated by reference in its entirety.

BACKGROUND INFORMATION

Nano-fabrication includes the fabrication of very small structures that have features on the order of 100 nanometers or smaller. Although well known within the integrated circuit industry, nano-fabrication techniques may be applied in the bio-domain, solar cells industry, battery industry and/or other industries. See, for example, U.S. Patent Publication No. 2007/0031505, U.S. Pat. No. 6,918,946, U.S. Patent Publication No. 2008/0121279, Kelly, J. and DeSimone, J., *Shape-specific monodisperse nano-molding of protein particles*, J. Am. Chem. Soc. 2008, vol. 130, pgs. 5437-5439, and Canelas, D., Herlihy, K, and DeSimone, J., *Top-down particles fabrication: control of size and shape for diagnostic imaging and drug delivery*, WIREs Nanomedicine and Nanobiotechnology, 2009, vol. 1, pgs. 391-404.

Imprint lithography techniques include formation of a relief pattern in a formable layer positioned on a substrate. The substrate may be coupled to a motion stage to obtain a desired positioning to facilitate the patterning process. The patterning process may use a template spaced apart from the substrate and the formable liquid applied between the template and the substrate. The formable liquid is solidified to form features on the substrate conforming to the shape of the template that contacts the formable liquid. After solidification, the template is separated from the features and the substrate is subjected to additional processing to form functional nanoparticles (e.g., drug delivery devices, batteries, and the like).

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
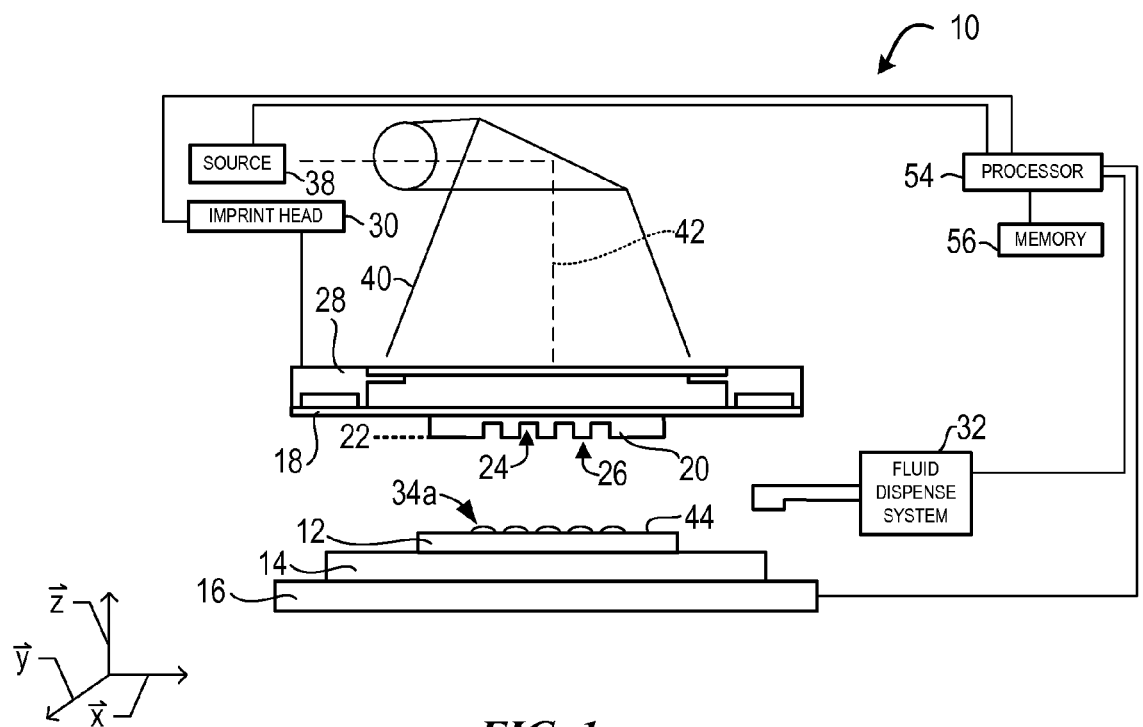
FIG. 1 illustrates a simplified side view of a lithographic system in accordance with embodiments of the present invention.
Figure 2:
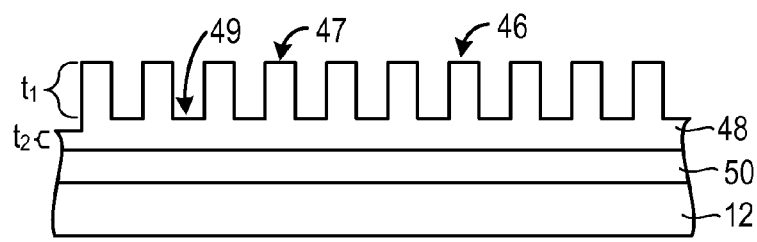
FIG. 2 illustrates a simplified side view of the substrate shown in FIG. 1 having a patterned layer positioned thereon.

Referring to the figures, and particularly to FIGS. 1 and 2, illustrated therein is a lithographic system 10 used to form functional nano and/or micro particles on substrate 12. Substrate 12 may be coupled to substrate chuck 14. As illustrated, substrate chuck 14 is a vacuum chuck. Substrate chuck 14 however, may be any chuck including, but not limited to, vacuum, pin-type, groove-type, electrostatic, electromagnetic, and/or the like. Exemplary chucks are described in U.S. Pat. No. 6,873,087, U.S. Ser. Nos. 11/108,208, 11/047,428, 11/047,499, and 11/690,480, all of which are hereby incorporated by reference herein in their entirety.

Substrate 12 and substrate chuck 14 may be further supported by stage 16. Stage 16 may provide rotational and/or translational motion in relation to the x, y and z axes. Stage 16, substrate 12, and substrate chuck 14 may also be positioned on a base (not shown).

Spaced-apart from substrate 12 is template 18. Template 18 may include mesa 20 extending therefrom towards substrate 12, with mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such a configuration. For example, patterning surface 22 may be substantially flat. Generally, patterning surface 22 may be defined as any original pattern that forms the basis of a pattern to be formed on substrate 12. Additionally, template 18 may be treated with an anti-adhesion agent (e.g., Relmat, FTOS). Exemplary anti-adhesion agents include, but are not limited to those described in U.S. Ser. No. 09/976,681, which is hereby incorporated by reference in its entirety.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein in its entirety. Further, chuck 28 may be coupled to imprint head 30 such that chuck 28 and/or imprint head 30 may be configured to facilitate movement of template 18. Additionally, chuck 28 may be configured to adjust and/or vary the structure of template 18 prior to imprinting, during imprinting, and/or subsequent to imprinting (e.g. during separation).

System 10 may further comprise fluid dispense system 32. Fluid dispense system 32 may be used to deposit functional material 34*a* on substrate 12. Functional material 34*a* may have use within the bio-domain, solar cell industry, battery industry, and other industries requiring a functional nanoparticle. For example, functional material 34*a* may include, but is not limited to, biomaterials (e.g., PEG), solar cell material (e.g., N-type material, P-type material), polymerizable materials, and/or the like.

Functional material 34*a* may be positioned on substrate 12 using techniques such as drop dispense, spin-coating, dip coating, chemical vapor deposition (CVD), physical vapor deposition (PVD), thin film deposition, thick film deposition, and/or the like. It should be noted that the positioning of functional material 34 on substrate 12 may be configured to limit the amount of waste. For example, use of drop dispense in positioning of functional material 34 on substrate 12, as compared to spin-coating and the like, may limit the amount of non-useable fluid during formation of functional nanoparticles.

Substrate 12 may include the use of a removable layer 50. Removable layer 50 may facilitate separation of solidified functional material 34a from substrate 12 as described herein. Examples of materials for use in removable layer 50 may include, but are not limited to PVA or PMMA.

Referring to FIGS. 1 and 2, system 10 may further comprise solidification source 38 (e.g., energy source) coupled to direct a medium 40 (e.g., energy) along path 42 to solidify functional material 34a. Imprint head 30 and stage 16 may be configured to position template 18 and/or substrate 12 in superposition with path 42. System 10 may be regulated by processor 54 in communication with stage 16, imprint head 30, fluid dispense system 32 and/or source 38, and may operate on a computer readable program stored in memory 56.

Either imprint head 30, stage 16, or both may vary a distance between mold 20 and substrate 12 to define a desired volume therebetween that is filled by functional material 34a. For example, imprint head 30 may apply a force to template 18 such that mold 20 contacts functional material 34a. After the desired volume is filled with functional material 34a, source 38 may produce medium 40, e.g. UV radiation, causing functional material 34a to solidify and/or cross-link conforming to a shape of surface 44 of substrate 12 and patterning surface 22, defining patterned layer 46 on substrate 12. Patterned layer 46 may comprise a residual layer 48 and/or features (e.g., protrusions 47 and recessions 49). Protrusions 47 may have a thickness $t_1$ and residual layer 48 may have a thickness $t_2$.

Figure 3:
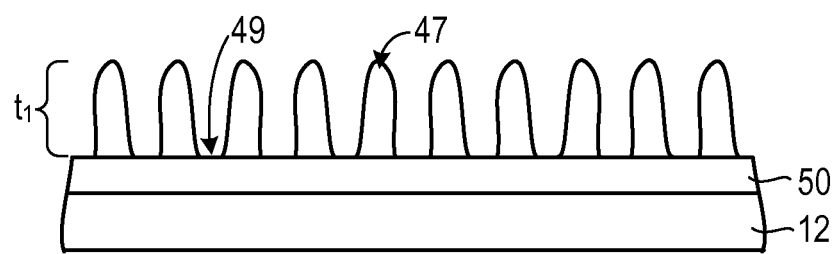
FIG. 3 illustrates a simplified side view of the substrate shown in FIG. 2 having multiple protrusions formed thereon.

Referring to FIGS. 2 and 3, after solidification, patterned layer 46 may be subjected to further processing to clean patterned layer 46 and/or further separate protrusions 47 to form pillars 52. For example, patterned layer 46 may be subjected to an oxygen plasma etching. Etching may remove at portion of residual layer 48 as illustrated in FIG. 3.

Figure 4:
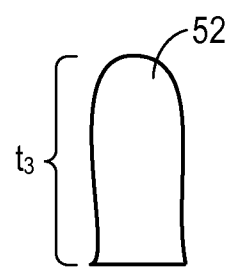
FIG. 4 illustrates a simplified side view of a pillar formed by release of the protrusions of FIG. 3.

Referring to FIGS. 3 and 4, release of protrusions 47 from substrate 12 may form pillars 52. For example, substrate 12 may be subjected a solution that may include, but is not limited to, water (e.g., de-ionized water), organic solvents (e.g., diluted HF), mild basic components, and/or the like. The solution may release protrusions 47 from substrate 12 to form pillars 52 having a thickness $t_3$.

Etching of protrusions 47 subsequent to solidification of functional material 34a may distort the configuration of protrusion 47 such that thickness $t_2$ of protrusion 47 is substantially different from thickness $t_3$ of the resulting pillar 52. The amount of degradation of shape may limit the accuracy and/or precision of dimensionality when forming pillars 52. Such distortion may be detrimental depending on the design consideration for the pillar 52. For example, when pillars 52 are functional nanoparticles used as drug delivery devices, geo-targeting of destinations for pillar 52 within a body (e.g., human, animal, and/or the like) may be misdirected by alterations and/or distortion in shape.

Separation of template 18 from patterned layer 46 may also cause separation defects in pillars 52. Although release layers (e.g., FOTS, Relmat, and the like) may be provided on substrate 12, template 18 or both, the surface area of patterned layer 46 coupled to substrate 12 may be less than the surface area of patterned layer 46 coupled to template 18 prior to separation. Materiality of release layers and/or functional material 34 in combination with the dynamics of the surface area may provide separation defects in pillars 52.

FIGS. 5A-5E illustrate schematic side views of formation of pillars 52a minimizing degradation and separation distortion. By minimizing degradation and separation distortion, accuracy and/or precision of pillar formation may be controlled forming functional nanoparticles (i.e., pillars 52a).

Pillars 52a are formed of functional material 34a. Functional material 34a includes material used in industries including, but not limited to, the bio-domain, solar cell industry, battery industry, and the like. Functional material 34a may have use within the bio-domain, solar cell industry, battery industry, and other industries requiring a functional nano-particle. For example, functional material 34a may include, but is not limited to, biomaterials (e.g., PEG), solar cell material (e.g., N-type material, P-type material), polymerizable materials, and/or the like.

FIGS. 5A-5E account for use of (1) properties of functional material 34a; and (2) imprint lithography materials (e.g., sacrificial material 34a, BT20, release properties of template 18a and 18b, and/or the like) by using sacrificial material 34b and imprint lithography techniques to form recesses recesses 49a and 47a that may be filled with functional material 34a. Without accounting for both properties of functional material 34a and properties of imprint lithography materials, degradation and separation distortion increases.

Generally, pillars 52a may be formed using one or more imprint lithography processes. For example, sacrificial material 34a may form protrusions 47a and recessions 49a using a first template 18a through the processes and systems described in relation to FIGS. 1 and 2. For example, sacrificial material 34a (e.g., monomer mixture) may be solidified on a multi-layer substrate 70 to form patterned layer 46a having a first set of protrusions 47a and recessions 49a. The pattern formed by protrusions 47a and recessions 49a may be used to form a second set of protrusions 47b and recessions 49b in removable layer 50a. Functional material 34a (e.g., biomaterial) may then be deposited in recessions 49b in removable layer 50a to form pillars 52a. Alternatively, functional material 34a may be deposited on removable layer 50a and patterned by a second template 18b using the processes and systems as described in relation to FIGS. 1 and 2 to form pillars 52 in removable layer 50a. Pillars 52a may then be released from multi-layer substrate 70.

Figure 5A:
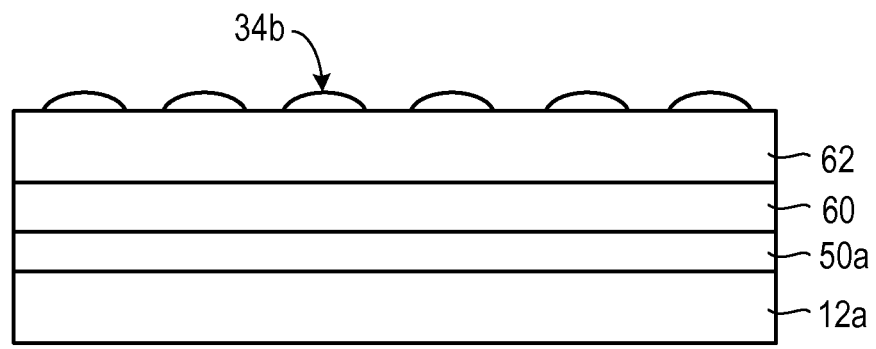
FIGS. 5A-5F illustrate simplified side views of formation of pillars in accordance within an embodiment of the present invention.

Referring to FIG. 5A, sacrificial material 34b may be deposited on multi-layer substrate 70. Sacrificial material 34b may be formed of materials including, but not limited to, a polymerizable fluid comprising a monomer mixture as described in U.S. Pat. No. 7,157,036 and U.S. Patent Publication No. 2005/0187339, both of which are hereby incorporated by reference herein in their entirety.

Multi-layer substrate 70 may include a base layer 12a, a removable layer 50a, a protection layer 60 and an adhesion layer 62. Base layer 12a may be similar to substrate 12 described in relation to FIG. 1. Base layer 12a may be formed of materials including, but not limited to, fused-silica, quartz, silicon, organic polymers, siloxane polymers, borosilicate glass, fluorocarbon polymers, metal, hardened sapphire, and/or the like.

Removable layer 50a may be positioned adjacent to base layer 12a. Removable layer 50a may be similar to removable layer 50 described in relation to FIG. 3. For example, removable layer 50a may release pillars 52a when subjected a solution including, but not limited to, water (e.g., de-ionized water), organic solvents (e.g., diluted HF), mild basic components, and/or the like.

Protection layer 60 may be positioned adjacent to removable layer 50a. Materiality of protection layer 60 may minimize damage and/or distortion of removable layer 50a during imprinting and/or etching. For example, protection layer 60 may be formed of materials such as PECVD silicon oxide and the like.

Adhesion layer 62 (e.g., BT20) may be positioned adjacent to protection layer 60. During processing of patterned layer 46a, adhesion layer 62 may minimize separation distortion by adhering patterned layer 46a to multi-layer substrate 70 during separation of template 18 from patterned layer 46a.

Figure 5B:
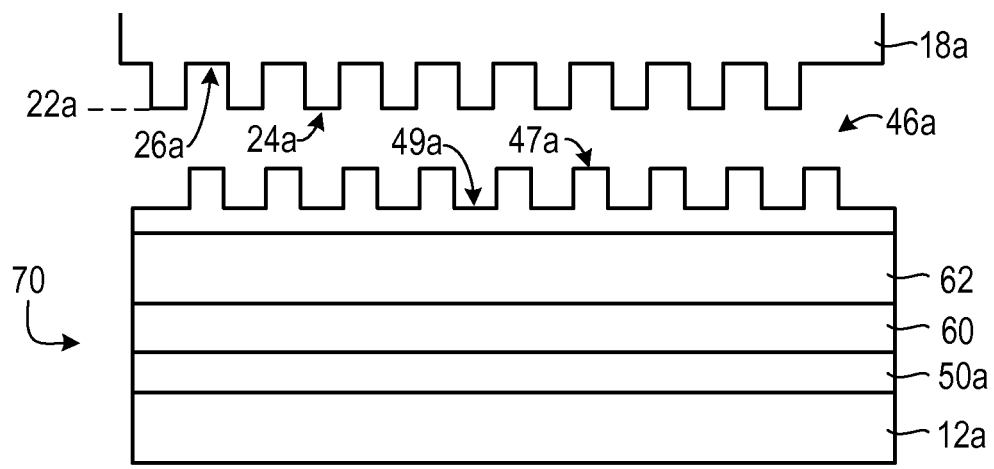

Referring to FIG. 5B, features (e.g., 47a and 49a) of patterned layer 46a may be formed on multi-layer substrate 70 using first template 18a as described in relation to the system 10 and processes described in FIGS. 1 and 2. It should be noted that patterned layer 46a may be formed by other nanolithography techniques including, but not limited to, optical lithography, x-ray lithography, extreme ultraviolet lithography, scanning probe lithography, atomic force microscopic nanolithography, magneto lithography, and/or the like.

Figure 5C:
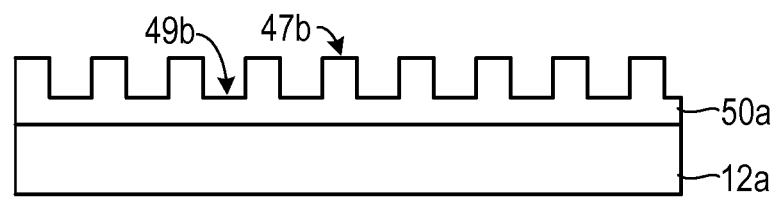
Figure 5D:
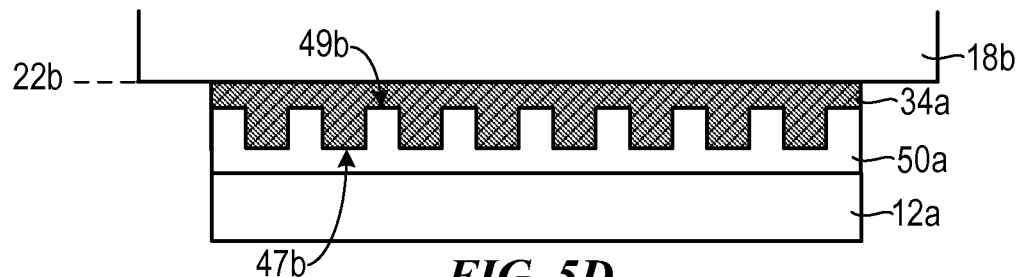

Referring to FIGS. 5C-5D, subsequent to formation of patterned layer 46a on multi-layer substrate 70, features (e.g., 47a and 49a) may aid in forming features (e.g., 47b and 49b) in removable layer 50a. For example, features (e.g., 47a and 49b) may be etched in multi-layer substrate 70 forming features (e.g., 47b and 49b) in removable layer 50a. Exemplary techniques include, but are not limited to, techniques described in U.S. Ser. Nos. 10/396,615 and 10/423,642, both of which are hereby incorporated by reference in their entirety.

In an optional step, portions of removable layer 50a or entire removable layer 50a may be exposed to UV ozone and/or $O_2$ plasma. Exposure to UV ozone and/or $O_2$ plasma may alter wetting characteristics of portions of removable layer 50a for a given material. Alterations of wetting characteristics may increase depth and/or aspect ratio, and/or reduce filling time and filling defect.

Figure 5E:
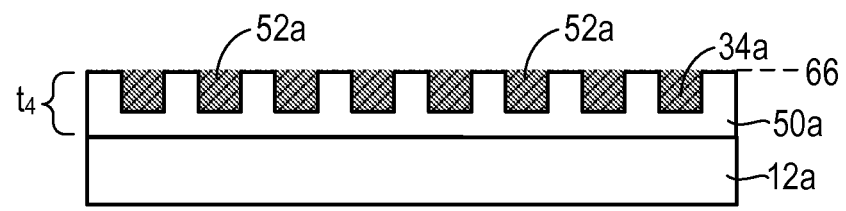

Referring to FIGS. 5D and 5E, functional material 34a (e.g., biomaterial) may be deposited on patterned removable layer 50a. Functional material 34a may be deposited using techniques such as drop dispense, spin-coating, dip coating, chemical vapor deposition (CVD), physical vapor deposition (PVD), thin film deposition, thick film deposition, and/or the like depending on design considerations. For example, by depositing functional material 34a using drop dispense techniques, the amount of functional material 34a deposited on removable layer 50a may be conserved.

Functional material 34a may fill in recessions 49b in removable layer 50a forming pillars 52a. In one embodiment, portions of functional material 34a deposited on removable layer 50a may be removed to form pillars 52a. Removal of portions of functional material 34a provides a crown layer 66 (e.g., substantially planar layer) exposing pillars 52a. Portions of functional material 34a may be removed using techniques including, but not limited to, blanket etching, CMP polishing, and/or similar methods. For example, if functional material 34a is formed of metal, crown layer 66 may be formed by metal etchants including, but not limited to, $Cl_2$, $BCl_3$, other Chlorine based etchants, and/or the like. It should be noted that the metal etchants are not limited to chlorine based etchants. For example, some metals, such as Tungsten, may be etched using Fluorine based etchants. Crown layer 66 may be formed by etching using an imprinting resist as a mask or by using a hardmask for pattern transfer. For example, crown layer 66 may be formed by using a hardmask formed of materials including, but not limited to, Cr, Silicon Oxide, Silicon Nitride, and/or the like. Alternatively, if functional material 34a is formed of Silicon based material. Crown layer 66 may be formed by etching Silicon using common Silicon etchants including, but not limited to, $CF_4$, $CHF_3$, $SF_6$, $Cl_2$, HBr, other Fluorine, Chlorine and Bromine based etchants, and/or the like. Additionally, crown layer 66 may be etched using an imprint resist as a mask, a hardmask for pattern transfer, or the like. For example, crown layer 66 may be etched using a hardmask formed of materials including, but not limited to, Cr, Silicon Oxide, Silicon Nitride, and/or the like.

In another embodiment, a second template 18b may be used to form pillars 52a from functional material 34a deposited on removable layer 50a. Template 18b may be positioned in superimposition with functional material 34a on removable layer 50a. Template 18b may contact functional material 34a and functional material 34a may be solidified. Template 18b may then be separated. It should be noted that template 18b may optionally include coatings (e.g., FOTS) that aid in separation of template 18b from solidified functional material 34a as described herein.

Use of template 18b may provide a substantially planar edge in solidified functional material 34a. The surface area between solidified functional material 34a and template 18b may be selected such that it is less than the surface area between solidified functional material 34a and removable layer 50a. For example, template 18b may be substantially planar. By reducing the surface area of solidified functional material 34a and template 18b as compared to the surface area of solidified functional material 34a and removable layer 50a, separation defects of solidified functional material 34a may be reduced.

Referring to FIG. 5E, solidified functional material 34a and/or removable layer 50a may be removed to provide a crown layer 66. For example, solidified functional material 34a and/or removable layer 50a may be removed by blanket etching, CMP polishing, and/or similar methods to provide crown layer 66 (e.g., planarized layer). Pillars 52a may be positioned in recesses 49b of removable layer 50a.

Figure 5F:
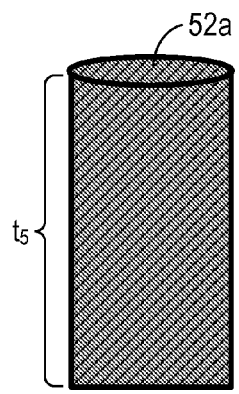

Referring to FIGS. 5E and 5F, pillars 52a may be released from removable layer 50a. For example, removable layer 50a may be subjected a solution that may include, but is not limited to, water (e.g., de-ionized water), organic solvents, inorganic acids (e.g., diluted HF), mild basic components, and/or the like, causing pillars 52a to be released from multi-layer substrate 70.

Figure 6A:
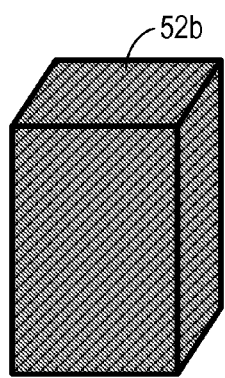
FIGS. 6A-6C illustrate perspective views of exemplary pillars.
Figure 6B:
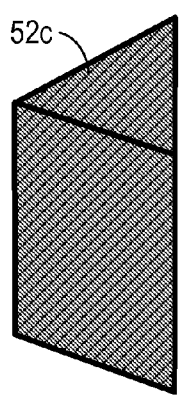
Figure 6C:
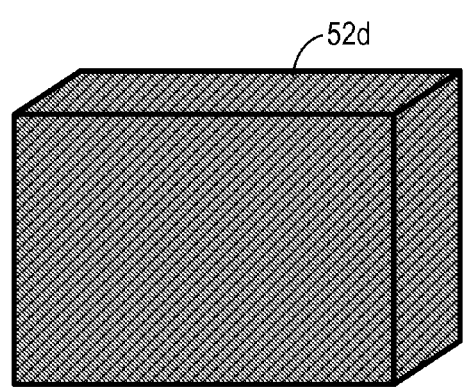

Dimensions provided by the crowning of solidified functional material 34a and the dimensions provided by removable layer 50a may define edges of pillars 52a, and as such, the volume of pillars 52a. By adjusting these dimensions, pillars 52a may be constructed having varying shapes and sizes. For example, as illustrated in FIGS. 6A-6C, pillars 52a may be constructed in shapes including, but not limited to, circular, triangular, rectangular, fanciful, and the like. By controlling the dimensions of removable layer 50a and planarization of solidified functional material 34a, shape, accuracy and precision of formation of pillars 52a may also be controlled. Further, pillars 52a may be formed using exemplary techniques described in U.S. Ser. No. 12/616,896, which is herein incorporated by references in its entirety.

Figure 7:
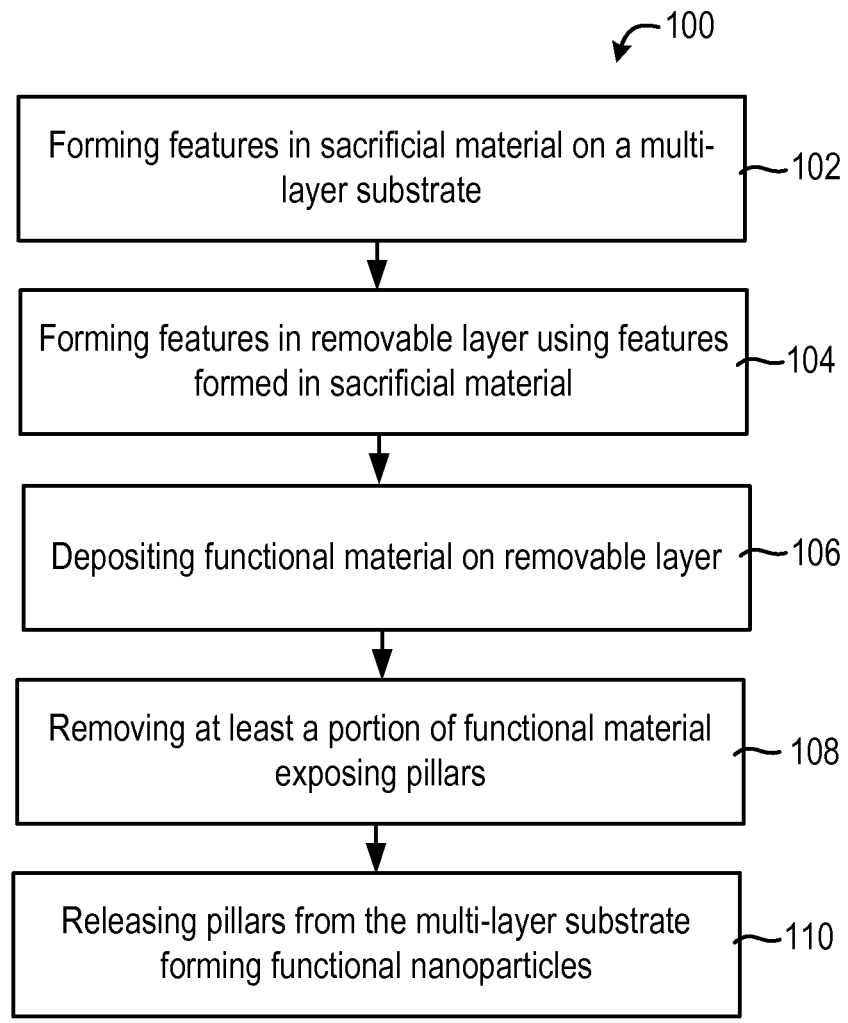
FIG. 7 illustrates a flow chart of an exemplary method 100 of forming pillars 52*a* using imprint lithography.

FIG. 7 illustrates a flow chart of an exemplary method 100 for forming pillars 52a using an imprint lithography system. Formation of pillars 52a may include one or more lithography steps (e.g., nano-imprint lithography). In a step 102, sacrificial material 34b may be patterned on a multi-layer substrate 70. For example, sacrificial material 34b may be patterned using a first imprint lithography process using first template 18a to provide patterned layer 46a having features 47a and 49a. In a step 104, features 47a and 49a may be used to form features 47b and 49b in removable layer 50a. For example, features 47a and 49a may be etched into multi-layer substrate 70 to provide features 47b and 49b in removable layer 50a.

In an optional step, removable layer 50a may be exposed to UV ozone and/or O₂ plasma. In a step 106, functional material 34a (e.g., biomaterial) may be deposited on removable layer 50a and solidified. In a step 108, a portion of functional material 34a may be patterned and/or removed to provide crown surface 66 exposing pillars 52a. In a step 110, pillars 52a may be released from multi-layer substrate 70.

FIGS. 8A-8E illustrate simplified side views of another embodiment for forming pillars 52b. Generally, formation of pillars 52b may comprise one or more imprint lithography steps Referring to FIG. 8A, sacrificial material 34b may be deposited on multi-layer substrate 70b. Sacrificial material 34b may be formed of materials including, but not limited to, a polymerizable fluid comprising a monomer mixture as described in U.S. Pat. No. 7,157,036 and U.S. Patent Publication No. 2005/0187339, both of which are hereby incorporated by reference herein in their entirety.

Multi-layer substrate 70b may include a base layer 12b (e.g., Si), a removable layer 50b (e.g., SiO₂), and an adhesion layer 62b (e.g., BT20). Base layer 12b may be similar to substrate 12 described in relation to FIG. 1. Base layer 12b may be formed of materials including, but not limited to, fused-silica, quartz, silicon, organic polymers, siloxane polymers, borosilicate glass, fluorocarbon polymers, metal, hardened sapphire, and/or the like.

Removable layer 50b may be positioned adjacent to base layer 12b. Removable layer 50b may be similar to removable layer 50 described in relation to FIG. 3. For example, removable layer 50b may release pillars 52a when subjected a solution including, but not limited to, water (e.g., de-ionized water), organic solvents (e.g., HF), mild basic components, and/or the like.

Functional material 34a (e.g., Si) may be positioned adjacent to removable layer 50b. Adhesion layer 62b (e.g., BT20) may be positioned adjacent to functional material 34a. During processing of patterned layer 46b (shown in FIG. 8B), adhesion layer 62b may minimize separation distortion by adhering patterned layer 46b to multi-layer substrate 70b during separation of template 18 from patterned layer 46b. In one embodiment, functional material 34a may be exposed to UV ozone and/or O₂ plasma. Exposure of functional material 34a to UV ozone and/or O₂ plasma may render adhesion layer 62b obsolete such that patterned layer 46b may be formed directly on functional material 34a without use of adhesion layer 62b.

Figure 8A:
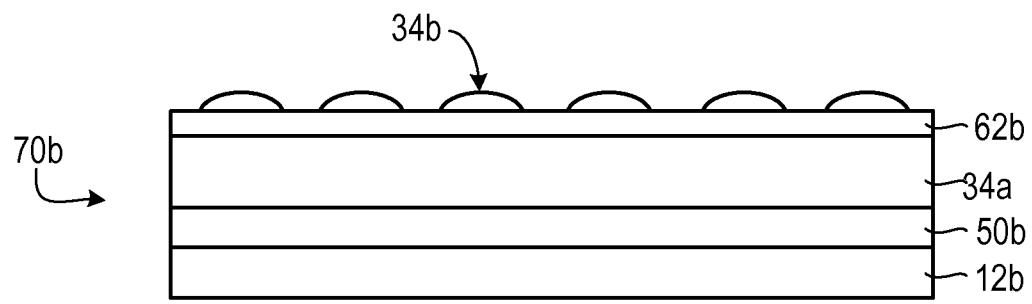
FIGS. 8A-8E illustrate simplified side views of formation of pillars in accordance with an embodiment of the present invention.
Figure 8B:
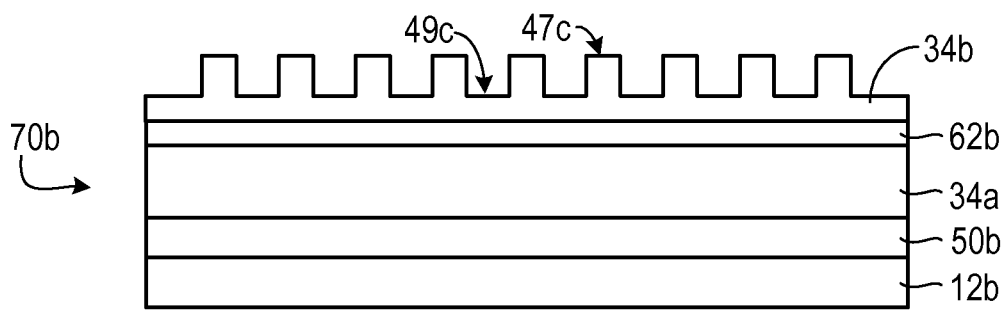

Referring to FIG. 8B, features (e.g., 47c and 49c) of patterned layer 46b may be formed on multi-layer substrate 70b using template 18 as described in relation to the system 10 and processes described in FIGS. 1 and 2. It should be noted that patterned layer 46b may be formed by other nano-lithography techniques including, but not limited to, optical lithography, x-ray lithography, extreme ultraviolet lithography, scanning probe lithography, atomic force microscopic nanolithography, magneto lithography, and/or the like.

Figure 8C:
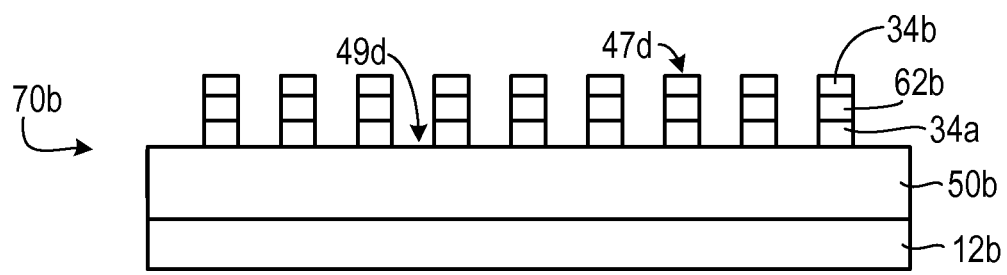

Referring to FIG. 8C, features (e.g., 47c and 49c) may be etched in multi-layer substrate 70b forming features (e.g., 47d and 49d) in functional material 34a. Exemplary techniques include, but are not limited to, techniques described in U.S. Ser. Nos. 10/396,615 and 10/423,642, both of which are hereby incorporated by reference in their entirety. For example, portions may be removed using techniques including, but not limited to, blanket etching, CMP polishing, and/or similar methods. For example, metal etchants may be used including, but not limited to, Cl₂, BCl₃, other Chlorine based etchants, and/or the like. It should be noted that the metal etchants are not limited to chlorine based etchants. For example, some metals, such as Tungsten, may be etched using Fluorine based etchants. Additionally, features (e.g., 47d and 49d) may be formed by etching using an imprinting resist as a mask or by using a hardmask for pattern transfer. For example, features (e.g., 47d and 49d) may be formed by using a hardmask formed of materials including, but not limited to, Cr, Silicon Oxide, Silicon Nitride, and/or the like. Alternatively, Silicon etchants may be used including, but not limited to, CF₄, CHF₃, SF₆, Cl₂, HBr, other Fluorine, Chlorine and Bromine based etchants, and/or the like. Additionally, features (e.g., 47d and 49d) may be etched using an imprint resist as a mask, a hardmask for pattern transfer, or the like. For example, features (e.g., 47d and 49d) may be etched using a hardmask formed of materials including, but not limited to, Cr, Silicon Oxide, Silicon Nitride, and/or the like.

Figure 8D:
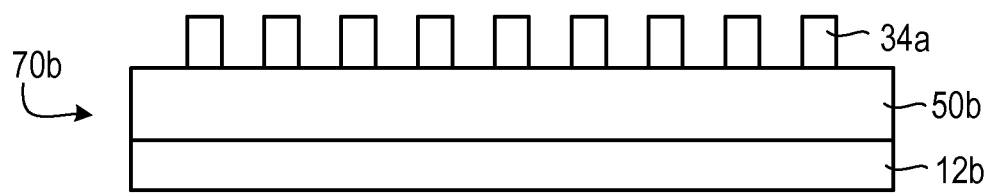
Figure 8E:
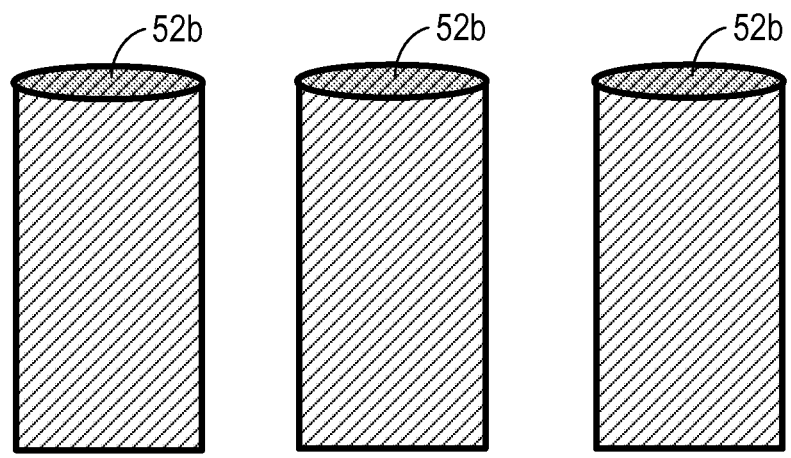

Referring to FIGS. 8C-8E, sacrificial material 34b and adhesion layer 62b (if needed) may be stripped from functional material 34a. Removable layer 50b may be subjected to a chemical process (e.g., HF dip) such that functional material 34a is removed from multi-layer substrate 70 forming one or more pillars 52b (i.e., functional nanoparticles).

What is claimed is:

1. A method of forming functional nanoparticles, comprising:
    forming a multi-layer substrate comprising, a removable layer and a sacrificial material layer coupled to the removable layer;
    patterning the sacrificial layer using a first imprint lithography template to provide a patterned layer having a residual layer and a pattern of a plurality of protrusions and a plurality of recessions;
    transferring the pattern of protrusions and recessions into the removable layer;
    depositing functional material within recessions of the removable layer;
    patterning the functional material to provide a patterned functional material layer having a plurality of pillars in the removable layer; wherein the patterning of the functional material includes imprinting using a second imprint lithography template and wherein the second imprint lithography template is substantially planar, and,
    releasing the pillars from the multi-layer substrate, the released pillars forming functional nanoparticles comprising the functional material.

2. The method of claim 1, wherein the functional material is a biomaterial.

3. The method of claim 1, wherein releasing of the pillars includes subjected the removable layer to a solution comprising water, organic solvents, and mild basic components.

4. The method of claim 1, the sacrificial material layer is formed of a polymerizable fluid comprising a monomer mixture.

5. The method of claim 1, wherein the multi-layer substrate further comprises a base layer coupled to the removable layer.

6. The method of claim 1, further comprising exposing at least a portion of the removable layer to UV ozone altering wetting characteristics of the removable layer.

7. The method of claim 1, wherein functional material of functional material layer is deposited on the patterned layer by drop dispense.

8. The method of claim 1, wherein surface area between patterned functional material layer and the second template is less than surface area between patterned functional material layer and the removable layer.

9. The method of claim 1, wherein patterning of the functional material includes forming a crown layer by etching using an imprinting resist as a mask.

10. The method of claim 1, wherein shape of at least one pillar is selected from the group consisting of circular, triangular, and rectangular.

11. The method of claim 1, wherein the multi-layer substrate further comprises a protection layer coupled to the removable layer, the protection layer formed of materials minimizing damage and distortion of removable layer during transferring of the pattern of protrusions and recessions into the removable layer.

12. The method of claim 11, wherein the multi-layer substrate further comprises an adhesion layer coupled to the protection layer, the adhesion layer adhering the patterned layer to the multi-layer substrate during patterning of the functional material using a second imprint lithography template.

13. A method of forming functional nanoparticles, comprising:
 forming a plurality of features in a sacrificial material layer of a multi-layer substrate, the multi-layer substrate having a base layer, a removable layer coupled to the base layer, and the sacrificial material layer coupled to the removable layer;
 transferring features of the sacrificial material layer into the removable layer forming a plurality of protrusions and a plurality of recessions in the removable layer;
 depositing functional material in recessions of the removable layer;
 planarizing the functional material by imprinting with a substantially planar imprint lithography template to form a patterned layer of functional material having a plurality of pillars formed in the recessions of the removable layer;
 removing functional material positioned outside of recessions of the removable layer such that a crown surface is formed, the crown surface providing an edge of each pillar of functional material formed in the recessions of the removable layer; and,
 releasing pillars of functional material from the removable layer, the released pillars forming functional nanoparticles comprising the functional material.

14. The method of claim 13, further comprising exposing removable layer to UV ozone prior to deposition of functional material.

15. The method of claim 13, wherein functional material is a biomaterial and sacrificial material layer is formed of polymerizable material comprising a monomer mixture.

16. The method of claim 13, wherein releasing of the pillars includes subjected the removable layer to a solution comprising water, organic solvents, and mild basic components.

17. The method of claim 13 wherein the multi-layer substrate further comprises a protection layer coupled to the removable layer, the protection layer formed of materials minimizing damage and distortion of removable layer during transferring of the pattern of protrusions and recessions into the removable layer.

18. A method of forming functional nanoparticles, comprising:
 forming a plurality of recessions in a removable layer;
 depositing functional material in the recessions of the removable layer;
 planarizing the functional material to form a patterned layer of functional material having a plurality of pillars formed in the recessions of the removable layer; wherein the planarizing of the functional material includes imprinting using an imprint lithography template that is substantially planar;
 removing a portion of the functional material to expose portions of the removable layer between formed pillars of the functional material; and,
 releasing pillars of functional material from the removable layer, the released pillars forming functional nanoparticles comprising the functional material.

19. The method of claim 18, wherein the removable layer is coupled to a base layer.

20. The method of claim 18, wherein the functional material is deposited in the recessions of the removable layer by drop dispense.

21. The method of claim 18, wherein the functional material is a biomaterial.

22. The method of claim 18, wherein releasing the pillars includes subjecting the removable layer to a solution comprising water, organic solvents, and mild basic components.

23. The method of claim 18, wherein the forming of a plurality of recessions in the removable layer further comprises the steps of:
 depositing sacrificial material onto the removable layer;
 forming a patterned layer of the sacrificial material, the patterned layer having a plurality of recessions; and
 transferring the pattern of the plurality of recessions into the removable layer.

24. The method of claim 23 wherein the forming of a patterned layer further comprises using an imprint lithography template.

25. The method of claim 23 wherein the sacrificial material is deposited on the removable layer by drop dispense.

26. The method of claim 23 wherein the sacrificial material is deposited on the removable layer by spin-on processes.

27. The method of claim 23 wherein forming a patterned layer further comprises UV or thermal curing of the sacrificial layer.

\* \* \* \* \*

UNITED STATES PATENT AND TRADEMARK OFFICE
CERTIFICATE OF CORRECTION

PATENT NO.       : 8,961,800 B2                            Page 1 of 1
APPLICATION NO.  : 12/854359
DATED            : February 24, 2015
INVENTOR(S)      : Sidlgata V. Sreenivasan et al.

It is certified that error appears in the above-identified patent and that said Letters Patent is hereby corrected as shown below:

IN THE CLAIMS:

Column 8, line 30, claim 1, after "layer" insert -- coupled --, therefore.

Column 8, line 42, claim 1, delete "layer;" and insert -- layer, --, therefore.

Column 8, line 45, claim 1, delete "planar," and insert -- planar; --, therefore.

Signed and Sealed this
Twenty-second Day of December, 2015

Michelle K. Lee
*Director of the United States Patent and Trademark Office*